US010802067B2

(12) United States Patent
Kalokitis

(10) Patent No.: US 10,802,067 B2
(45) Date of Patent: Oct. 13, 2020

(54) APPARATUS AND METHOD FOR MONITORING AND CONTROLLING DETECTION OF STRAY VOLTAGE ANOMALIES USING A PHOTONIC SENSOR

(71) Applicant: OSMOSE UTILITIES SERVICES, INC., Peachtree City, GA (US)

(72) Inventor: David Kalokitis, Robbinsville, NJ (US)

(73) Assignee: Osmose Utilities Services, Inc., Peachtree City, GA (US)

(*) Notice: Subject to any disclaimer, the term of this patent is extended or adjusted under 35 U.S.C. 154(b) by 465 days.

(21) Appl. No.: 15/101,186

(22) PCT Filed: Jan. 6, 2015

(86) PCT No.: PCT/US2015/010256
§ 371 (c)(1),
(2) Date: Jun. 2, 2016

(87) PCT Pub. No.: WO2016/073020
PCT Pub. Date: May 12, 2016

(65) Prior Publication Data
US 2016/0363621 A1    Dec. 15, 2016

Related U.S. Application Data

(60) Provisional application No. 61/924,502, filed on Jan. 7, 2014.

(51) Int. Cl.
*G01R 31/08* (2020.01)
*G01R 29/08* (2006.01)
(Continued)

(52) U.S. Cl.
CPC ........... *G01R 31/083* (2013.01); *G01R 15/24* (2013.01); *G01R 19/165* (2013.01);
(Continued)

(58) Field of Classification Search
CPC ...... G01R 31/083; G01R 31/00; G01R 15/24; G01R 31/021; G01R 19/165; G01R 29/0814
See application file for complete search history.

(56) References Cited

U.S. PATENT DOCUMENTS 9,065,572 B1 * 6/2015 Wach .................. H04B 10/506
2005/0073322 A1   4/2005 Hibbs et al.
(Continued)

FOREIGN PATENT DOCUMENTS

JP       05-281263 A    10/1993
JP      2002257884 A     9/2002
(Continued)

OTHER PUBLICATIONS

Chavez et al., "Accurate Voltage Measurement with Electric Field Sampling using Permittivity-Shielding", IEEE Transactions on Power Delivery, vol. 17, Issue 2, pp. 362-368, Apr. 2002.
(Continued)

*Primary Examiner* — Akm Zakaria
(74) *Attorney, Agent, or Firm* — Moser Taboada

(57) ABSTRACT

The present invention is directed towards a mobile apparatus mounted to a motor vehicle for detecting energized objects. In some embodiments, the mobile apparatus comprising two or more photonic sensors, mounted to the motor vehicle, and coupled to a photo-receiver, wherein the photo-receiver generates a signal corresponding to an electric field detected by the two or more photonic sensors, for narrowing down the location of a hazardously energized object, a processor, coupled to the two or more photonic sensors, that digitizes the signal to form electric field data, produces field strengths of each of the at least one sensor probes, analyzes the field strengths to identify a general location of the hazardously energized object in the electric field, wherein the electric field data is analyzed based on an expected frequency
(Continued)

pertaining to hazardous energy to locate an energized object proximate a street; and an indicator, coupled to the processor, that alerts a user to a presence of the energized object in the electric field proximate the street.

15 Claims, 10 Drawing Sheets

(51) Int. Cl.
    *G01R 29/14*     (2006.01)
    *G01R 31/58*     (2020.01)
    *G01R 15/24*     (2006.01)
    *G01R 19/165*     (2006.01)

(52) U.S. Cl.
    CPC ..... *G01R 29/0871* (2013.01); *G01R 29/0885* (2013.01); *G01R 29/14* (2013.01); *G01R 31/58* (2020.01)

(56) References Cited

U.S. PATENT DOCUMENTS

| | | | |
|---|---|---|---|
| 2006/0232284 A1 | 10/2006 | Condon et al. | |
| 2007/0279067 A1* | 12/2007 | Wiswell | G01R 29/12 324/457 |
| 2008/0255779 A1* | 10/2008 | Hull | G01R 29/12 702/57 |
| 2009/0027281 A1* | 1/2009 | Walters | G01R 29/14 343/703 |
| 2009/0066952 A1* | 3/2009 | Wu | G01R 29/0885 356/365 |
| 2009/0195255 A1 | 8/2009 | Kalokitis et al. | |
| 2011/0066379 A1* | 3/2011 | Mes | G01V 3/165 702/6 |
| 2011/0184679 A1 | 7/2011 | Kalokitis | |
| 2011/0221602 A1 | 9/2011 | Gelbien et al. | |
| 2013/0015979 A1 | 1/2013 | Kalokitis et al. | |

FOREIGN PATENT DOCUMENTS

| | | |
|---|---|---|
| JP | 2007010438 A | 1/2007 |
| WO | WO-2008087464 A2 | 7/2008 |

OTHER PUBLICATIONS

Kalokitis, "Detection and Mitigation of Stray Voltage in Underground Distribution Systems", IEEE Draft, pp. 1-33, Aug. 31, 2007.
Extended European Search Report dated Dec. 14, 2017 for Application No. 15857788.2.
International Search Report and Written Opinion dated May 30, 2016.
S. Chadderdon et al., "Multi-Axis All Dielectric Electric Field Sensors", Photonic Microdevices/Microstructures for Sensing IV, SPIE, 1000 20$^{th}$ St., Bellingham, WA 98225-6705, vol. 8376, No. 1, May 11, 2012, pp. 1-10.

* cited by examiner

APPARATUS AND METHOD FOR MONITORING AND CONTROLLING DETECTION OF STRAY VOLTAGE ANOMALIES USING A PHOTONIC SENSOR

BACKGROUND

Field

The present invention relates to the detection of electric fields, and more particularly, to apparatus and methods of detecting stray voltage anomalies in electric fields using a photonic sensor.

Description of the Related Art

Large power distribution systems, especially those in large metropolitan areas, are subject to many stresses, which may occasionally result in the generation of undesirable or dangerous anomalies. An infrequent, but recurrent problem in power distribution infrastructures is the presence of "stray voltages" in the system. These stray voltages may present themselves when objects, such as manhole covers, gratings, street light poles, phone booths and the like become electrically energized (e.g., at 120V AC). An electrically conductive path may be established between underground secondary network cabling and these objects through physical damage to electrical insulation resulting in direct contact between electrically conductive elements or through the introduction of water acting as a conductor. These energized objects present obvious dangers to people and animals in the general public.

Detecting the existence of stray voltages by means of assessing electromagnetic radiation is not practical because the wavelength of a 60 Hz electromagnetic wave is approximately 5,000 kilometers (i.e., about 3,107 miles) in length. To effectively radiate electromagnetic waves, a radiating object (e.g., manhole cover or light pole) should represent at least ¼ wavelength (i.e., about 776.75 miles) and a receiving "antenna" should be 1½ to 2 wavelengths away from the emitting source (about 6,214 miles). Two wavelengths is the distance required for electric and magnetic fields to come into time phase and space quadrature where they behave as a plane wave. A detection system will typically be perhaps 10 ft. to 30 ft. away from the energized object, so that detection will take place in the extreme near field where electric and magnetic fields exist in a complex temporal and spatial pattern, not as a unified electromagnetic plane wave. Thus, electric and magnetic fields must be considered and measured separately.

Due to power distribution networks typically having many miles of buried cable carrying perhaps thousands of amperes of current, the magnetic field in any one location due to such normal load is likely to be very high. Detecting magnetic fields arising from a relatively weak stray voltage anomaly would be very difficult due to the interference from strong ambient magnetic fields arising from normal loads and, therefore, it has been determined that the best way to detect a stray voltage anomaly is to assess the electric field.

Techniques for the detection of stray voltages are typically carried out by manual inspection of surrounding electrical infrastructures for signs of leaking current. An inspection team equipped, for example, with hand held detection devices may be employed to make direct physical inspections of electrical infrastructures. However, inspectors using these detection devices are typically required to make contact with portions of electrical infrastructures, such as street-lamp bases or manhole covers, in order to obtain accurate measurements for determining the existence of potentially dangerous stray voltages. These manual inspections are undoubtedly time-consuming and give a false sense of security.

Accordingly, there exists a need to provide a more efficient means for detecting and identifying sources of stray voltage anomalies over vast geographic areas, particularly, populated urban, suburban and rural areas.

SUMMARY

Apparatus and methods for detecting stray voltage anomalies in electric fields are provided herein. In some embodiments, an apparatus for detecting an electrical field may comprise: at least one sensor probe for generating data corresponding to an electrical field detected by the at least one sensor probe; a processor, coupled to the at least one sensor probe, for analyzing the data to identify a voltage anomaly in the electric field; and an indicator, coupled to the processor, for alerting a user to a presence of the voltage anomaly in the electric field.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
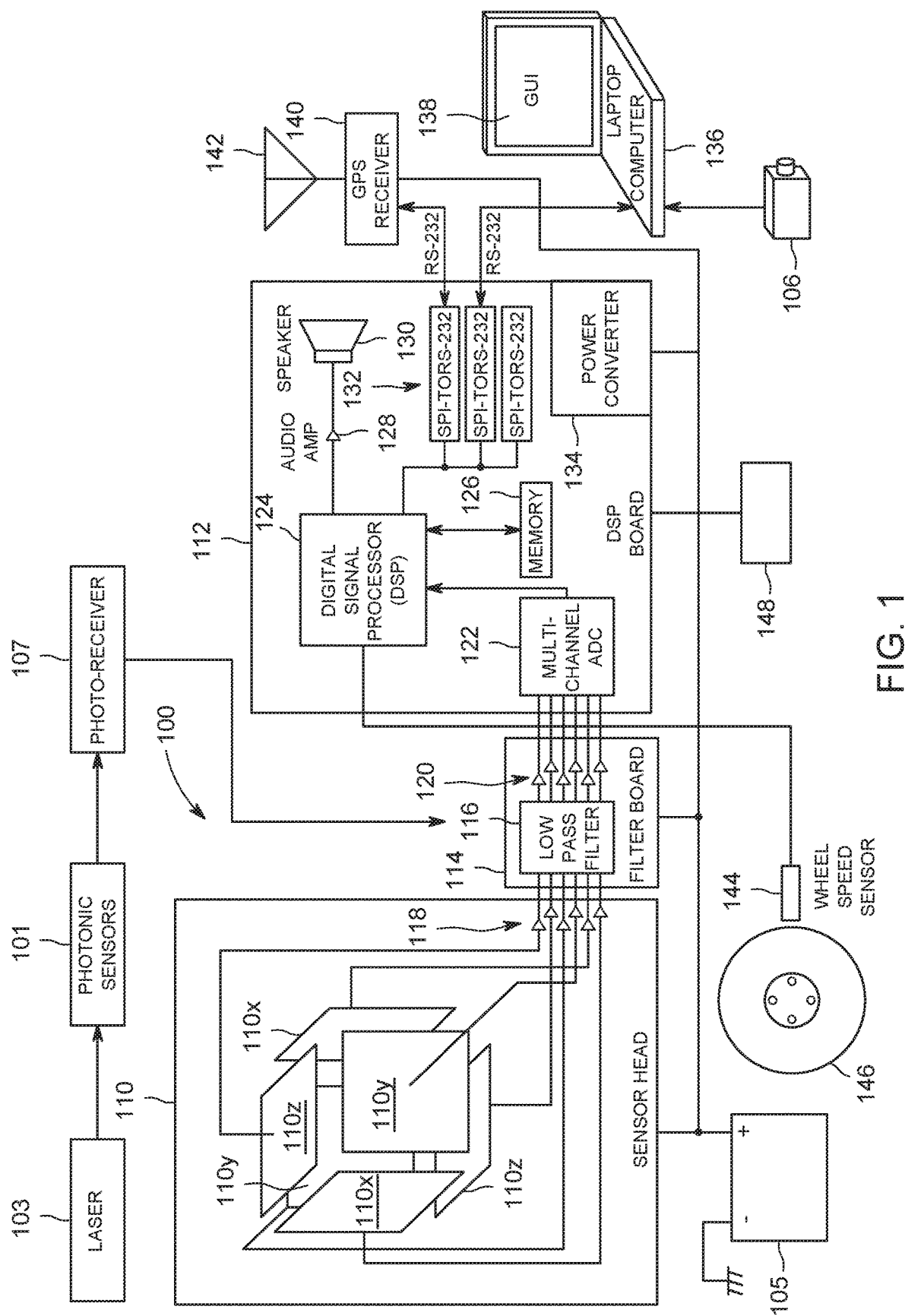
FIG. 1 is a schematic diagram of an exemplary sensor system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to apparatus and methods for detecting a stray voltage anomaly in an electric field using a photonic sensor. For purposes of clarity, and not by way of limitation, illustrative depictions of the present invention are described with references made to the above-identified drawing figures. Various modifications obvious to one skilled in the art are deemed to be within the spirit and scope of the present invention.

Figure 2:
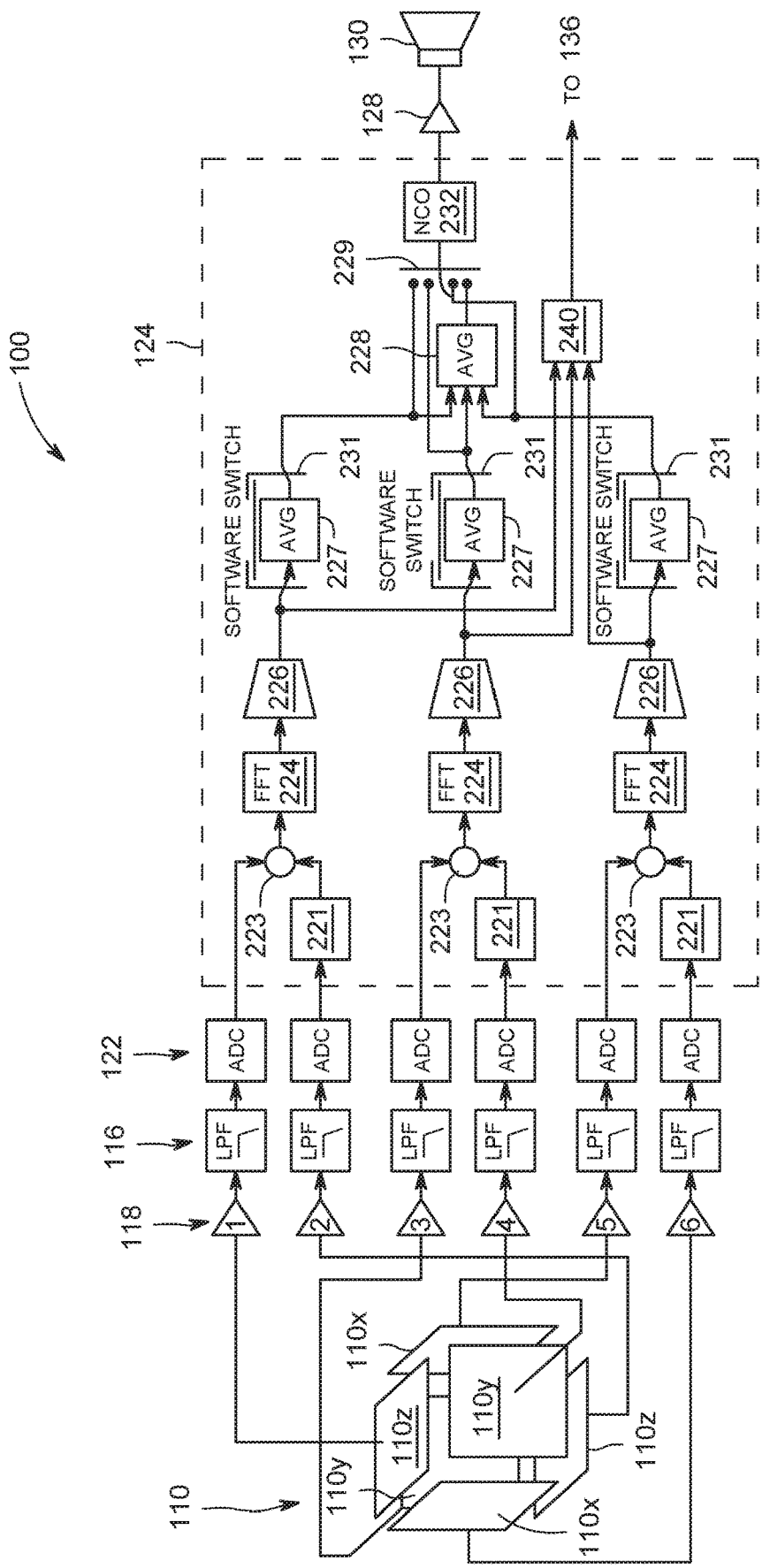
FIGS. 2-2A are schematic diagrams illustrating the operation of the sensor system employing digital electronic processing in accordance with some embodiments of the present invention.
Figure 2A:
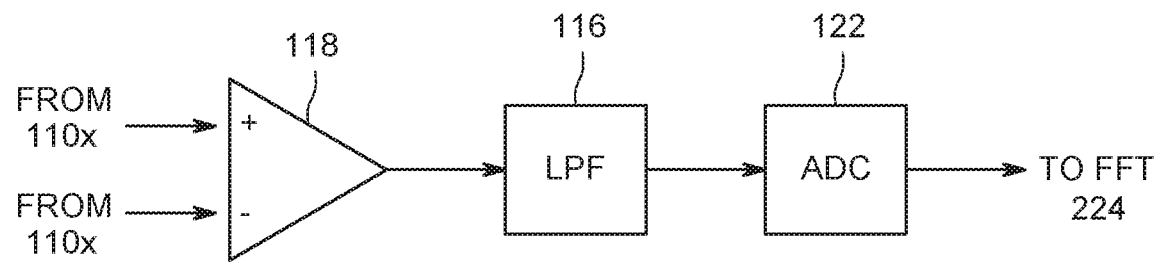

FIG. 1 is a schematic diagram of an exemplary sensor system in accordance with some embodiments of the present invention. FIGS. 2-2A are schematic diagrams illustrating the operation of the sensor system employing digital electronic processing in accordance with some embodiments of the present invention. To best understand the invention the reader should refer to FIGS. 1, 2 and 2A simultaneously.

In accordance with some embodiments of the present invention, sensor system 100 generally comprises a photonic sensor unit 101 and a detection system unit (DSU) 110. The photonic sensor 101 accepts the broadband laser 103 as an input and outputs a digital signal to a photo receiver 107. According to exemplary embodiments, the photonic sensor 101 is composed of electro-optic (EO) materials. An electric field is established between a stray voltage source and the ground. The orientation of sensor 101 may be modified to detect horizontal or vertical field components, with a cross-polarization extinction ratio of approximately 20 dB. Multiple photonic sensors may also be used to expand the time range for detecting anomalous voltages. In some embodiments, the laser 103 may be a 1550 nm laser, coupled to the input of the sensor 101 via a polarization-maintaining (PM) fiber optic cable. The output from the photonic sensor 101 is coupled to the photo-receiver 107 via a single-mode fiber optic cable, the readings from which are coupled to the DPS 112 via the analog section 114. According to exemplary embodiments, the photonic sensor 101 may be mounted to a vehicle in place of DSU 110. In other embodiments, the photonic sensor 101 and the accompanying laser 103 and the photo-receiver 107 may be mounted to a vehicle along with the DSU 110 for mobile detection of stray voltage anomalies. In some embodiments, the photonic sensor 101 is a lithium niobate waveguide-based Mach Zehnder interferometer.

In exemplary embodiments, the minimum detectable field by the photonic sensor 101 is defined as the field level at which the power signal is equal to the noise in a 1 Hz bandwidth, according to the following formula:

$$E_{min} = E_0 10^{-(P_{signal} - P_{noise})/20}$$

According to some embodiments, the electric field amplitude may vary significantly over a series of measurements by the photonic sensor 101. In some instances, this may be caused by variation of sensor response with time due to temperature dependence and fluctuation of power in laser 103. These fluctuations are compensated by monitoring the optical power from the laser 103 and sensor 101 and scaling the measurements accordingly, as described in "Advanced Materials and Device Technology for Photonic Electric Field Sensors", J. E. Toney, V. E. Stenger, S. A. Kingsley, A. Pollick, S. Sriram and E. Taylor, Proc. SPIE, Vol. 8519 (2012).

The readings from the DSU 110 are used initially to locate a general area within which stay anomalous voltages are measured. In order to further narrow down the particular location of the stray voltage anomaly, the photonic sensor 101 measurements are input to the input analog section 114, comprised of filters 116 and amplifiers 120. The output from the amplifiers 120 are digitized by the analog to digital converter 122 of the DPS 112 and then converted to electric field strengths by the DPS 112, as described below. The photonic sensor 101 is based on non-conducting materials that are minimally perturbing to the electric field and therefore allow for greater precision than the DSU 110.

According to one embodiment, the DSU 110 is first enabled by the laptop computer 136 while a vehicle (coupled to the mount shown in FIG. 6) begins a route to search for anomalous voltages. As the vehicle drives the route, the DPS 112 analyzes the field strength and may determine that a general location likely has an energized object. Once the DPS 112 establishes that a stray voltage from an energized object is determined to be in the general location, the laptop computer 136 may disable reading measurements of electric field strengths from DSU 110 and enable the photonic sensor 101. Because the photonic sensor 101 produces more accurate readings in a small area, the DPS 112 digitizes raw electric field readings from the sensor 101 as the vehicle traverses the general location slowly. The DPS 112 converts the readings to electric field strengths and analyzes the field strengths, as described below, to determine whether there is an energized object at the current location based on the most recent digitized and analyzed field strengths. The local sensitivity of the photonic sensor 101 enables a precise determination of the location of an energized object with anomalous and potentially dangerous voltage levels. Once the energized object with an anomalous voltage is located, the vehicle may continue on its route to locate determine whether other energized objects are around.

The DSU 110 may receive electric field measurements from one or more sensor probes, wherein each sensor probe comprises of at least one electrode. For example, sensor probes 110x, 110y or 110z each may respectively comprise two electrodes 110x-110x, 110y-110y and 110z-110z. The DSU 110 may employ any number of sensor probes for purposes of measuring an electric field in any particular area of interest being surveyed for stray voltage anomalies in electric fields, such as the embodiments discussed below with respect to FIGS. 3-5 and 7-8A. For example, the DSU 110 may employ only one of said sensor probes 110x, 110y or 110z, additional sensor probes to supplement the measurements obtained by sensor probes 110x, 110y or 110z or, any other suitable combination of sensor probes. For example, in some embodiments, it may be such that the signals from one pair of electrodes do not ordinarily provide electric field data that is of interest, e.g., as where high-field producing overhead power distribution wires are present, and so the pair of electrodes, e.g., 110z-110z, that sense the vertical field components may be, but need not be, omitted. In some embodiments, the DSU 110 may employ a multi-axis sensor probe arrangement as the ones described, for example, in commonly owned U.S. Pat. No. 7,248,054, filed Sep. 13, 2005 and issued on Jul. 24, 2007, and U.S. Pat. No. 7,253,642, filed Sep. 13, 2005 and issued on Aug. 7, 2007, which are hereby incorporated by reference in their entirety.

The sensor system 100 employs a digital processing system (DPS) 112 capable of processing electrode data provided by the DSU 110 and the photonic sensor 101 in near real time (e.g., with less than one second latency). It some embodiments, such as the embodiment depicted in FIG. 1, the DPS 112 is arranged to interface directly to a three-axis sensor probe arrangement, such as DSU 110.

In some embodiments, the DPS 112 comprises a multi-channel analog-to-digital converter (ADC) 122, a digital signal processor (DSP) 124, a memory (EEPROM) 126, an audio amplifier 128, audible transducing device (speaker) 130, one or more data converters 132 (e.g., uni-directional or bidirectional SPI to RS-232 converters), and a source of electrical power, such as a power converter 134. The power converter 134 provides the various voltages for operating the DPS 112 and other electronic devices. In some embodiments, electrical power for sensor system 100 may be obtained from any convenient electrical power source, such as the electrical system or battery 105 of the vehicle (e.g., truck) on or with which sensor system 100 is operated or a separate battery.

The DPS 112 is coupled to the photo-receiver 107 via a fiber optic connection. The photo-receiver 107 digitizes the signals from the photonic sensor 101. The DPS 112 performs, according to one embodiment, a 200 point Fast-Fourier transform over a frequency span of 0 to 100 (or 200 Hz), for an effective resolution bandwidth of 0.5 (or 1.0) Hz on the digitized signals from the photo-receiver 107. The DPS 112 is coupled to the DSU 110 via an input (analog) section 114, which comprises low pass filters 116 and buffer amplifiers 120. In some embodiments, for example such as the embodiment depicted in FIG. 1., the input section 114 comprises at least one (six shown) low pass filters 116, one for each electrode of sensor probes 110$x$, 110$y$, 110$z$, each preceded by an amplifier 118, and followed by a buffer amplifier 120. In some embodiments the amplifier 118 has a high input impedance and exhibits some gain.

In some embodiments, the low pass filter 116 cutoff frequency may be selected to minimize the effects of aliasing. For example, where the ADC 122 samples data provided from the sensor probes 110$x$, 110$y$, 110$z$ at a rate of 960 samples per second, a suitable low pass filter 116 may have a cutoff frequency (at −3 dB) of about 240 Hz and a −24 dB per octave slope. Thus, at 900 Hz, the first frequency that directly aliases the 60 Hz frequency of interest, the low pass filter 116 supplies a rejection or attenuation of about 46 dB.

In some embodiments, a suitable ADC 122 may operate at a conversion burst rate of about 842 KSPS (kilo-samples per second). For example, every $\frac{1}{960}^{th}$ of a second the ADC 122 is commanded to perform 96 conversions, specifically 16 readings of each of six electrodes 110$x$-110$x$, 110$y$-110$y$, 110$z$-110$z$. The readings converted by ADC 122 may be alternated such that temporal distortion effects are minimized. For example, ADC 122 converts plate electrode 1 (+110$z$) data, then plate electrode 2 (−110$z$) data, and so on through plate electrode 6 (−110$x$). It then repeats this six-conversion sequence 16 times for a total of 96 conversions. This burst of conversions takes approximately 114 microseconds (96/842 KHz), which is approximately 11% of the $\frac{1}{960}^{th}$ of second allotted for conversion, while reducing quantization errors by a factor of four. Other ADC arrangements and/or other ADC control arrangements may be employed.

The data may be transferred into memory 126 from the ADC 122 via a serial link driven by a Direct Memory Access (DMA) function within the DSP 124. In some embodiments, such as in FIG. 2, differential data may be obtained from single ended data provided to the DSP 124 by the negation 221 of one of the pair of single ended data values and the summing 223 of one single ended data value with the negated data value. In such embodiments, the single-ended signals from electrodes 110$x$-110$x$, 110$y$-110$y$, 110$z$-110$z$ may be coupled to the differential-to-single-end amplifiers 118 that provide balanced inputs with gain and convert the signal to single ended analog format to simplify subsequent processing, e.g., by lowpass filters 116. A multi-stage active low pass filter 116 then processes the signal to reduce signals other than the desired 60 Hz signal, i.e. to help separate the desired signal from near frequency interfering E-field signals. The signal is then further amplified and buffered and routed to ADC 122.

Upon completion of each 96 event burst conversion, as described above in reference to the operation of ADC 122, the DSP 124 averages the data to obtain six values (one for each of the six electrodes 110$x$-110$x$, 110$y$-110$y$, 110$z$-110$z$), and stores the six values, e.g., in a single row of a 6×256 point matrix of a memory internal to DSP 124. This action is repeated 256 times until the entire matrix of the internal memory of DSP 124 is filled, at which point DSP 124 performs six Fast Fourier Transforms (FFTs) 224 on the six column vectors. Each FFT 224 yields a frequency domain representation of the prior 256 samples (for each electrode 110$x$-110$x$, 110$y$-110$y$, 110$z$-110$z$) in the form of 128 complex values. Each of these complex values represents the phase and amplitude of the opposing electrode 110$x$-110$x$, 110$y$-110$y$, 110$z$-110$z$ signal within a bin 226 of 960 Hz/256=3.75 Hz. The $16^{th}$ FFT bin 226 contains the 60 Hz information, which is the only information that is of interest with respect to sensing stray 60 Hz voltages. Processor DSP 124 calculates the magnitude squared of this bin 226 data (its real part squared summed with its complex part squared), and assigns this value as the field strength for the electrode 110$x$-110$x$, 110$y$-110$y$, 110$z$-110$z$ that produced it. This process yields six field strength values at a rate of 960 Hz/256=3.75 Hz.

In some embodiments, such as depicted in FIG. 2A, differences between time domain values for the electrodes 110$x$-110$x$, 110$y$-110$y$, 110$z$-110$z$ are calculated, resulting in a 3×256 point matrix, which is then processed using the FFT 224 as described in the previous paragraph.

In some embodiments, measured field data from the sensor probes 110$x$, 110$y$, 110$z$ is stored as measured ("raw" data), e.g., as six sets of data as produced by the electrodes 110$x$-110$x$, 110$y$-110$y$, 110$z$-110$z$ or as three sets of differential data as produced the three pair of probe electrodes 110$x$-110$x$, 110$y$-110$y$, 110$z$-110$z$, or both. Data may be stored in a memory 126 of the DSP 124, or provided to a computer 136 or to any other device for storage and/or further analysis at the user's desire.

The computer 136 may provide a graphical user interface (GUI) 138 for an operator to control the operation of the sensor probes 110$x$, 110$y$, 110$z$, and sensor system 100, in particular, the DSP 124, and to monitor field data as measured. For example, an operator may adjust the values of the constants and scaling factors utilized in the detection and averaging processing for producing an audible alarm as described. An example of a command set for computer 138 is set forth below. The commands may be executed by single keystroke entries, plural keystroke entries, or mouse clicks. The data may be stored in any format that would allow the stored data to be exported to a readable format, such as a database, spreadsheet, text document, or the like.

Sensor System Command Set Listing

A brief description of example sensor system commands that are available to a user of the sensor system in accordance with some embodiments of the present invention follows. Commands may be executed in response to the symbol (given at the left margin below) being entered via the keyboard of computer or by a point-and-click entry. Note: Unrecognized characters generate a question mark "?" and an echo of that character to indicate that an invalid command has been entered.

H Display Help Screen—Causes the Help screen that lists all commands to be displayed.

{ Enter GPS Console Mode—GUI directly communicates with GPS and all keyboard entries are forwarded to GPS, i.e. not interpreted as SVD commands)

} Exit GPS Console Mode

Z Display Zulu time to the console

V Display current software Version number

L Display the current GPS Latitude, Longitude, Elevation and Zulu time

> Enter Stray Voltage Detect Data Spew Mode—Data for all six probe plates is displayed at the 3.75 Hz rate at which it is produced < Exit Stray Voltage Detect Data Spew Mode + Increase SVD audio alarm manual threshold by 1 dB (only in "P" or "D" beeper modes)

− Decrease SVD audio alarm manual threshold by 1 dB (only in "P" or "D" beeper modes)

P Differential Probe Mode OFF—Beep (audio tone) if signal from any probe plate exceeds the SVD threshold. (500 Hz tone @ 50% duty cycle at 3.75 Hz rate)

D Differential Probe Mode ON—Audio tone pitch is based on average of signals of all three differential plate pairs if in "S" or "U" modes (otherwise 500 Hz tone @ 50% duty cycle at 3.75 Hz rate if any differential pair of probes exceeds SVD threshold)

X Disable (or mute) the beeper (audio tone) until "P" or "D" or "S" command

S Audio tone pitch set proportional to 60 Hz field strength *squared*

U Audio tone pitch is un-weighted average of last 32 magnitude squared values.

| Toggle display to the next of speed (in mph), distance (in wheel speed pulses) and OFF F Display current vehicle speed (in mph).

A Put DSP in Automatic (data streaming) mode to display Log file as it is generated M Put DSP in Manual mode (for terminal control), exiting the "A" mode

Spew data display for the three differential probe pairs at a 60 lines/sec rate.

T Increase the "singer" (audio tone) cutoff threshold by ~0.5 dB and display new value t Decrease the "singer" (audio tone) cutoff threshold by ~0.5 dB and display new value G Increase "singer" (audio tone) pitch gain by ~0.5 dB and display new value g Decrease "singer" (audio tone) pitch gain by ~1 dB and display new value

* Restore default settings.

0 Operate in Differential Mode with tone based on average of all six plates (same as D above)

1 Operate in Differential Mode with tone based on plates 1-2 (top and bottom plates)

2 Operate in Differential Mode with tone based on plates 3-4 (left and right plates)

3 Operate in Differential Mode with tone based on plates 5-6 (fore and aft plates)

4 Connect X auxiliary electrodes together (toggle connect/disconnect)

5 Connect Y auxiliary electrodes together (toggle connect/disconnect)

6 Connect Z auxiliary electrodes together (toggle connect/disconnect)

$ Connect X auxiliary electrodes to common (toggle connect/disconnect)

% Connect Y auxiliary electrodes to common (toggle connect/disconnect)

^ Connect Z auxiliary electrodes to common (toggle connect/disconnect)

To this end, DSP 124 may further comprise a data streamer 240 which provides the unaveraged data independent of the settings of software switches 229, 231. Data provided by data streamer 240, e.g., in a SPI format, may be converted into another standard digital data format, e.g., into RS-232 format, by data converters 132. Data converters 132 may also convert data received in a given format, e.g., RS-232 format, into a format compatible with DSP 124, e.g., SPI format, as is the case for data provided by global positioning system (GPS) receiver 140. GPS receiver 140 may be any locating device capable of receiving signals from an antenna 142 broadcast by one or more GPS satellites orbiting the Earth to determine therefrom its location on the Earth.

Once the six field strength values (or three differential field strength values) are determined, higher-level procedures employ these six values (or three values) to produce data in a form that is meaningful to the user. For example, a simplistic detection alarm is available to the user that compares the six field strength values (or three differential field strength values) to a user-defined threshold, and activates a simple audible alarm provided by an audio amp 128 and a speaker 130, for example, a pulsing audio alarm, if any of these six values exceeds the threshold.

In some embodiments, the detection alarm may produce a continuous output whose pitch is proportional to the field strength. To accomplish the continuous aspect of this audible output, the field strength values may be calculated at a rate far greater than the basic 3.75 Hz of the FFT data. To this end, the processing algorithm performs the 256-point FFT 224 on the most recent 256 samples collected (for each electrode 110$x$-110$x$, 110$y$-110$y$, 110$z$-110$z$) as before, but to perform this operation at a 60 Hz rate. Thus after every 16 additional averaged sample set values are collected, the FFT 224 is re-performed, producing the six field strength values (one for each electrode 110$x$-110$x$, 110$y$-110$y$, 110$z$-110$z$) at a rate of 960 Hz/16=60 Hz. The large degree of time domain overlap from each FFT 224 to the next FFT 224 while using this process produces a far smoother output stream than is produced at the basic 3.75 Hz rate.

The field strength values produced by the FFT 224 process range from about zero to about two million. Reasonable example frequencies audible to humans for this type of detection system would fall into a range between approximately 70 Hz and approximately 3 KHz. The 16-bit timer-counter in the DSP 124 may further comprise a 4-bit prescaler that allows its incident clock to be pre-divided (prescaled) by a programmable value between about 1 to about 16. With a prescale factor of 16, an additional divide-by-two frequency reduction occurs due to the toggling nature of the counter-timer output as described above, and at a maximum period value of $2^{16}$=65536, an audio tone of 144 MHz/(16*2*65536)=68.66 Hz results. Because little useful data is contained in field strength values less than about 10, these field strength values are programmed to produce no audible output. For a field strength of 10, a 69.3 Hz tone results, brought about by 64939 being written into the timer-counter period register.

To compensate for the inability of typical human hearing to accurately discern pitch differences of an eighth of a step (a half-step is defined as a $2^{(1/12)}$ change in pitch, equivalent the difference between adjacent notes in the equal tempered chromatic scale commonly used in western music), the pitch table used is based upon this amount of pitch change, so that discrete pitch changes would be perceived as a continuum by a human listener. Thus, an incremental pitch change in the audio output of the sensor system 100 results in a frequency change of $+/-(1-2^{(1/96)})$, or $+/-0.7246\%$. The effect of an apparently continuous pitch output is thus achieved from a discrete pitch system. The 512-step pitch table employed covers a pitch range from 69.3 Hz to $2^{(512/96)}*69.3=2.794$ KHz.

In some embodiments, the field strength data from the DSP 124 may range from about 10 to about 2,100,000, or approximately 5.3 decades. This data is likewise parsed logarithmically to fit the 512 element pitch table, such that any increase of $10^{(1/96)}$ would produce an increase of one increment in pitch. So for every 10 dB that the field strength increases, the pitch of the audio output 275 increases by about one octave. The period value written into the timer counter is thus $144 \times 10^{6}$ divided by 32 (or 4.5 million) divided by the desired output frequency. The 512-element pitch table is thus made up of two columns, one representing field strength, and one representing timer-counter period. The process to determine the output audio pitch finds the field strength table value nearest to, but not greater than, the current actual field strength value, and applies the accompanying period value to a numerically controlled oscillator (NCO) 232.

In some embodiments, such as the embodiment described above, NCO 232 comprises both a period register and a timer register. When the timer register counts down to zero, it reloads from the period register and then counts down from the period value. The process described may only update the period register, thus avoiding the generation of transient pitch discontinuities that would sound to the ear as a "pop" or "crack." The count register may be updated during high-to-low or low-to-high transitions of the audio output, thereby producing a continuous quasi-portamento output tone.

In some embodiments, for example when an audio tone is the principal output to the user, further smoothing of the data may provide what could be considered a more pleasing audible output. Pitch discontinuities caused by vibration of the electrodes 110x-110x, 110y-110y, 110z-110z and other transient effects may make the audio output significantly less meaningful to the user. An unweighted 32-point averaging filter 227 directly preceding the NCO 232 in the audio processing chain, although it introduced an additional latency of 32/60 Hz=0.533 seconds to the system 100, may significantly mitigate these transient effects, thus increasing user effectiveness at interpreting the audio data. The total system latency, with this additional averaging filter 227 enabled (it can be enabled or disabled by the user via software switch 231), is thus 32/60 Hz+256/960 Hz=0.8 seconds. This is specifically the latency between the detection of a field by the sensor probe 110x, 110y, 110z and its resultant tone production by the audio system (e.g., audio amplifier 128 and speaker 130).

In some embodiments, the software of DSP 124 may be structured to support differential data when using the 60 Hz output data rate mode. Differential probe electrode data may be used to provide a higher signal-to-noise ratio compared to that of any single plate electrode. The user may be given the capability to select, e.g., setting software switches 229, 231, via the graphical user interface (GUI) 138 of computer 136, which of electrodes 110x-110x, 110y-110y, 110z-110z to use to drive the system audio amplifier 128 and speaker 130, plus a fourth option, the average 228 of all three pairs. The 60 Hz output data then controls a numerically controlled oscillator (NCO) 232 within DSP 124 for producing an audio pitch (tone) that is proportional to field strength.

Because the perception of pitch in humans is logarithmic, the raw field strength data is converted to a logarithmic scale by DSP 124, which may be accomplished in any convenient manner, e.g., by means of a look-up table.

In some embodiments, for certain DSP 124 devices, e.g., a type TMS320VC5509 digital signal processor available from Texas Instruments located in Dallas, Tex., the NCO 232 producing the audio output (nominally a square wave) is the output of a timer-counter integral to the DSP 124 integrated circuit (IC). The DSP 124 sets the frequency of this timer-counter by writing to it a period value. The nominal DSP 124 clock (144 MHz, in one example) causes the timer-counter to count down from this period value to zero, at which point an output signal toggles state from high to low (or from low to high).

In some embodiments, a Global Positioning System (GPS) receiver 140 provides a location reference including latitude, longitude, elevation, time and date so that the location of the sensor system 100 is known to a reasonably high precision. GPS position data may be exported to a conventional GPS mapping software for utilization. The GPS location information may be stored, e.g., in the memory of DSP 124 or of computer 136, so that there is a stored precision location and time reference associated with the stored measurements of 60 Hz field data from the DSU 110.

Thus, the GPS location data provides a record of the location at which each detected stray voltage field was detected and the time thereof, as may be desired for subsequent analysis, e.g., for reviewing the location of a stray voltage anomaly and identifying the source thereof. Because the peak of the response to a source of stray voltage anomaly cannot be ascertained until after the vehicle has passed the source, the exact location of the source may not be observed until after the time at which it is detected, i.e. until after it is passed. While having this stray voltage and location data recorded is desirable and beneficial, in a typical service environment, e.g., on a city street, it is not practical to stop the vehicle carrying system each time a stray voltage is detected, or to back the vehicle up to ascertain the exact location at which the detection took place.

Because the sensor system 100 may be operated in urban/city environments where buildings and other obstacles distort and/or block signals from a GPS satellite system from reaching the GPS antenna 142 via a direct path, GPS location information may have degraded accuracy, or may not be available. Other means of determining the location of the sensor system 100, such as a wheel speed sensor 144, may be utilized in place of, or in conjunction with, the GPS location information. Typically, wheel speed sensor 144 may detect revolutions of wheel 146 and, because the circumference of wheel 146 is known, distance and speed can be determined from the revolution of wheel 146.

For example, the wheel speed sensor 144 may produce four signals, typically pulses, for each revolution of wheel W, wherein each signal represents about 16 inches (about 40-41 cm) of linear travel. Most manhole covers MHC are about 30-40 inches (about 0.75-1.0 m) in diameter, and so wheel speed indications every one to two feet (about 0.3 to 0.6 m) is sufficient to locate a manhole MHC cover having stray voltage thereon. One suitable embodiment of wheel speed sensor 144 utilizes a Hall-effect sensor mounted so that the wheel lugs (studs and nuts) that secure wheel W to an axle pass close enough that the Hall-effect sensor produces a detectable output pulse therefrom.

This may advantageously eliminate the need for a transmitted or other 60 Hz timing reference and, therefore, it may be disposed on and operated from a vehicle moving at a substantial speed, e.g., up to 15-25 miles per hour (about 24-40 km/hr), or faster. In addition, this allows processing of the sensed stray voltage data in essentially "real time" so as to facilitate an operator understanding and responding to the sensed data. For example, in some embodiments the sensor system 100 may detect an energized manhole cover at a distance of about 15 feet (about 4.5 meters) when moving at speeds of up to about 10 mph (about 16 km/hr) or less, and consistently detect an energized light pole at a distance of about 25 feet (about 7.5 meters) when moving at speeds of up to about 20 mph (about 32 km/hr) or less.

In some embodiments, the sensor system 100 may additionally comprise an imaging system unit (ISU) 106, which may receive video input from one or more cameras. The ISU 106 may employ any number of cameras suitable for providing streaming images of a patrolled scene. Cameras employed may be video cameras, stereo cameras, various digital cameras, a combination of the aforementioned cameras or any other suitable camera and arrangement of cameras suitable for imagining a patrolled scene.

In some embodiments, one or more of cameras may be provided for imaging the environs where sensor system 100 is employed. For example, where sensor system 100 is deployed on a patrol vehicle or trailer, two cameras may be provided thereon, wherein each camera is directed to view in a direction about 90° to the left of the direction of travel and 90° to the right of the direction of travel, so that images of what is present to the left and to the right of the patrolling vehicle are obtained. Video images therefrom may be recorded sensor system 100 traverses a patrolled environment.

Video images may be obtained at a standard video rate, e.g., at 30 or 60 frames per second, but may be at much slower rates, e.g., one or two frames per second, consistent with the speeds at which the patrolling vehicle moves. For example, if a vehicle is moving at between 10 and 20 mph (about 14-28 feet per second or about 4.2-8.5 m/sec.), video at a two frames per second video rate would provide a new image for approximately each 14 feet (about 4.2 m) or less of travel, which should be sufficient to identify the location at which the stray voltage was detected.

The video images may all be recorded (stored) or only selected images may be recorded. In some embodiments, video images are stored in a video frame data buffer having a capacity to store a number of frames of video data for a set period of time. As each new frame is stored, the oldest previous frame is lost. Thus, the video data buffer contains video frames for the most recent period of time. In some embodiments, a "frame grabber" card, in the form of a PCMCIA card or an internal card, may be employed to synchronize electric field data sensed by DSU 110 with processed video data from ISU 106.

Upon detection of a stray voltage, the operator can cause the video images to be stored in a more permanent memory, or in another buffer, e.g., by activating a "Capture" function of computer 136, whereby the video of the scenes to the left and to the right of the vehicle over a thirty second period including the time at which the stray voltage was detected are stored and may be reviewed at the operator's convenience, e.g., either at that time or at a later time. Such storing action may be provided by inhibiting the video buffer from accepting additional frames of video data, thereby freezing the data then stored therein, or may be by transferring the data then stored in the video buffer to another memory device, such as the hard drive of computer 136 and/or a removable memory, e.g., a floppy disk, a CD ROM disk, a thumb drive, a memory card, a memory stick, or the like.

In some embodiments, in addition to storing the video images, the audio tones produced by the sensor system 100 (and/or data representing the tones), the GPS location data, the wheel speed sensor 144 data, or a combination thereof, are stored so that the video images may be reviewed in synchronism with the detection tone (and/or data representing the tone) and the GPS location to allow a user/operator to more accurately locate where the stray voltage was detected. For example, upon play back of the video data, the GPS location information may be displayed and/or the audio tone may be reproduced, so that the operator can accurately locate the source of the stray voltage. Control thereof may by icons and other controls provided by a graphical user interface (GUI) 138 of computer 136. Playback of the synchronized stored data may also be utilized for training personnel in operation of sensor system 100.

In some embodiments, the sensor system 100 may further comprise a transceiver component 148 configured to transmit and receive data transmissions to and from remote transceivers. For example, transceiver component 148 may be a transceiver of the type that is compatible with Wi-Fi standard IEEE 802.11, BLUETOOTH™ enabled, a combination of local area network (LAN), wide area network (WAN), wireless area network (WLAN), personal area network (PAN) standards or any other suitable combination of communication means to permit transmission of data. For example, transceiver component 148 may be a BLUETOOTH™ enabled device, thereby providing a means for communicating stray voltage related information between sensor system 100 and a remote device, such as a personal digital assistants (PDAs), cellular phones, notebook and desktop computers, printers, digital cameras or any other suitable electronic device, via a secured short-range radio frequency. Thereafter, a utility member equipped with the remote device configured to receive the stray voltage related communication may be dispatched to a site determined to have a potential stray voltage anomaly for purposes of neutralizing the anomaly. It should be noted that the aforementioned are provided merely as exemplary means for wireless transmission of stray voltage related data. Other suitable wireless transmission and receiving means may be employed in the present invention.

The computer 136 or other suitable computing system may provide a GUI 138 for an operator to control the operation of sensor system 100, particularly measurement and processing components associated with DSU 110, and to monitor electric field data as measured. For example, an operator may adjust the values of the constants and scaling factors utilized in the detection and averaging processing for producing an audible alarm (described in detail below). The computer 136 may also provide a convenient means for storing a record or log of the measured field and location (GPS) data for subsequent review and/or analysis, as might be desired for determining when and where a stray voltage anomaly existed.

GUI 138 receives data, directly or indirectly, from various components described in conjunction with sensor system 100 and, accordingly, displays them to the operator for purposes of controlling and monitoring the detection of stray voltage anomalies present in patrolled areas. GUI 138 may be a video based interface having a video display. The data provided to GUI 138 provides the interface operator with an opportunity to visually monitor and analyze incoming data measured by a stray voltage detection system on the video display.

Figure 3:
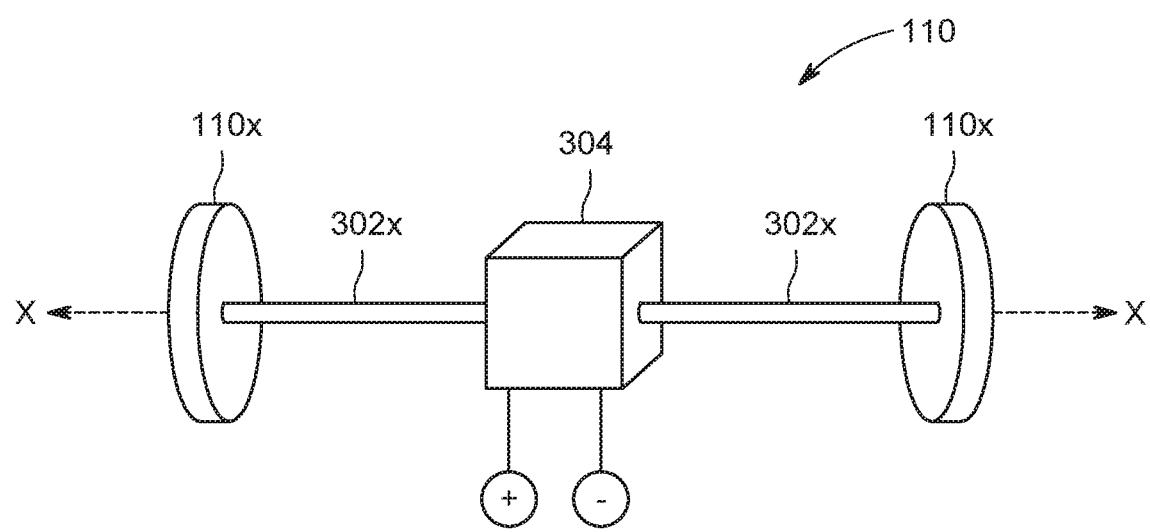
FIGS. 3-5 are illustrations of a detection system unit (DSU) in accordance with some embodiments of the present invention.

FIG. 3 is a schematic diagram of a DSU 110 in accordance with some embodiments of the present invention. In some embodiments, such as where the DSU 110 does not have access to a ground reference, the DSU 110 may use a differential sensor. DSU 110 may comprise two spaced-apart metalized plate electrodes 110x-110x (electrode pair 110x), separated by an insulating structure 302x. The insulating structure 302x may be rigid so that vibration or other physical motion of the DSU 110 while in the presence of static and low frequency fields does not cause spurious output in the 60 Hz frequency region. The electrodes 110x-110x may be connected to an amplifier 304. In some embodiments, the amplifier 304 is a high input impedance amplifier (e.g., about 60 Tera-ohms). Sensitivity of the DSU 110 is a function of the size and separation of the plate electrodes.

The efficiency and sensitivity of the DSU 110 may be negatively affected by interference from other electric fields. Interfering electric fields may be produced by other electrified devices, such as storefront signs, electronic devices, or the like. In addition, as people move about, e.g., as pedestrians, they tend to generate electric charges on their clothing. These interfering background electric fields caused by the electric charges associated with people typically occur in the DC to 20 Hz frequency range. The aforementioned potentially interfering electric fields may produce charges that can induce a voltage on the electrodes 110x-110x of the DSU 110, thus reducing the sensitivity of the DSU 110. This problem may be mitigated by employing feedback in the amplifier 304 (i.e., the differential pre-amplifier discussed above) that reduces its sensitivity to low frequency fields without reducing the very high input impedance at 60 Hz that helps give the sensor system 100 its high sensitivity to 60 Hz fields.

Figure 4:
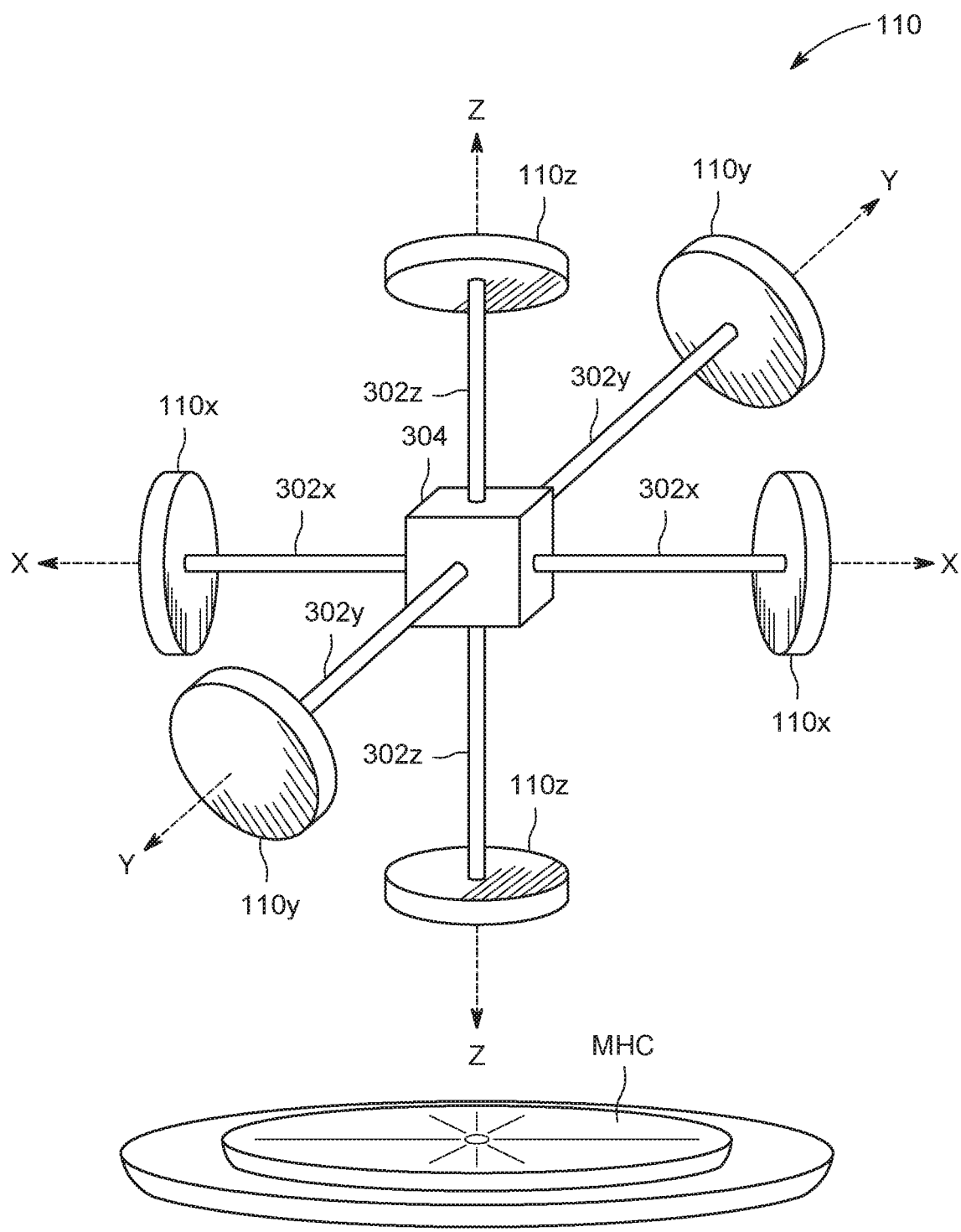

FIG. 4 is a schematic diagram of a three-axis (tri-axial) DSU 110 in accordance with some embodiments of the present invention. A three axis arrangement may be employed to make X, Y and Z-axis electric field measurements simultaneously. The DSU 110, depicted schematically in relation to a manhole cover MHC, comprises three pairs of spaced apart electrodes 110x-110x, 110y-110y, 110z-110z (electrode pairs 110x, 110y, 110z), of the sort shown in FIG. 2 arranged in three mutually orthogonal directions and each supported by an insulating structure 302x, 302y, 302z. A high input impedance amplifier 304 may be associated with each pair of electrodes, and may be embodied in any arrangement of differential circuitry, of single ended circuitry, or a combination thereof, as may be convenient.

Figure 5:
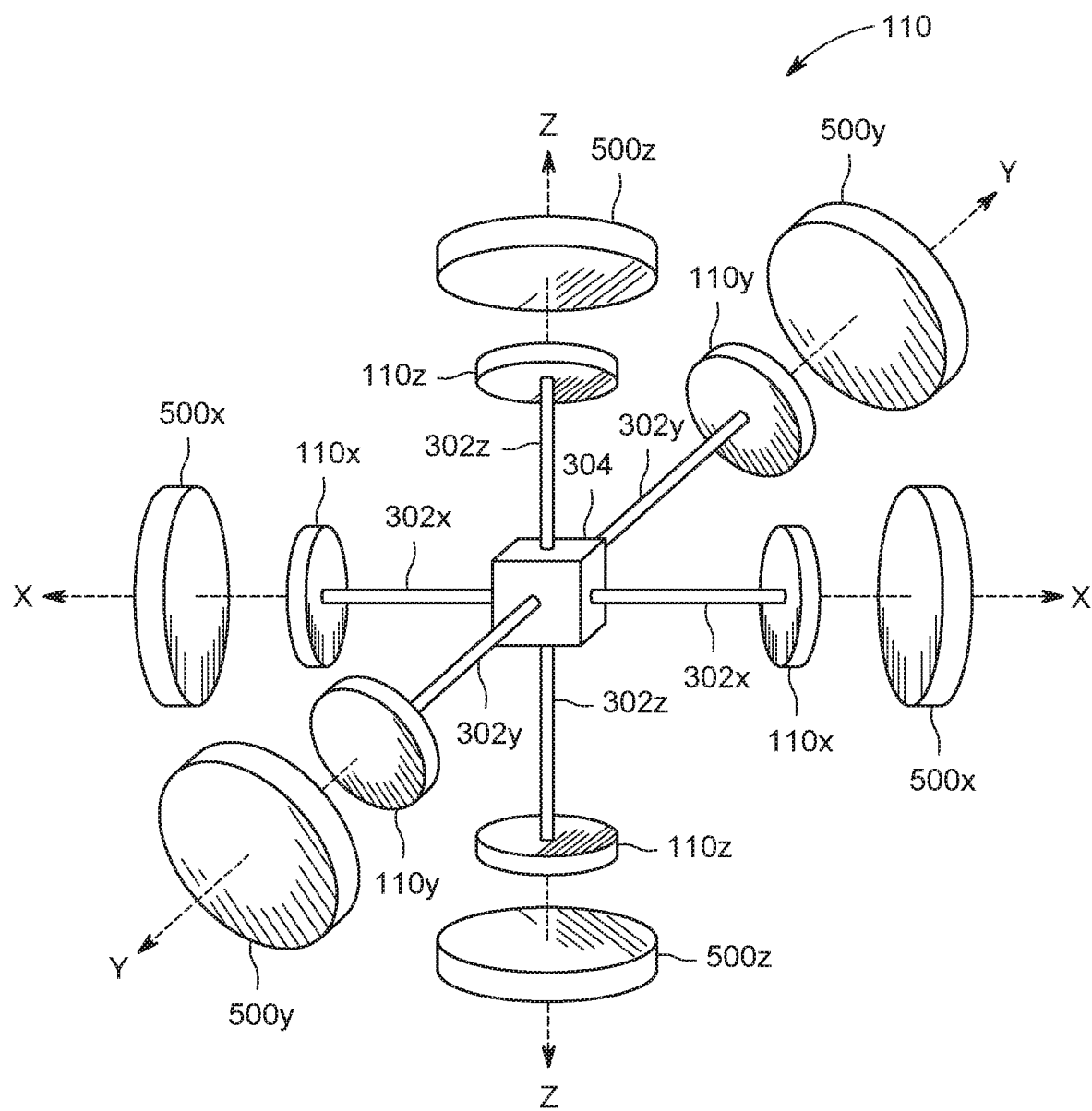

FIG. 5 is a schematic diagram of DSU 110 in accordance with some embodiments of the present invention. In some embodiments, DSU 110 may further comprise at least one pair (three shown) of electrically conductive auxiliary electrodes 500x-500x, 500y-500y, 500z-500z (auxiliary electrode pairs 500x, 500y, 500z) in addition to the electrode pairs 110x, 110y, 110z. The auxiliary electrode pairs 500x, 500y, 500z may be supported in a similar manner as the electrode pairs 110x, 110y, 110z as described above. In some embodiments, auxiliary electrodes 500x-500x, 500y-500y, 500z-500z may be planar and disposed generally parallel to each other and outboard of electrode pairs 110x, 110y, 110z (further from the center of DSU 110) along their respective axis.

The auxiliary electrodes 500x-500x, 500y-500y, 500z-500z may be any shape or size suitable to allow for accurate measurements. In some embodiments, the auxiliary electrodes 500x-500x, 500y-500y, 500z-500z may be smaller, the same size, or larger than the electrodes 110x-110x, 110y-110y, 110z-110z. In some embodiments, the auxiliary electrodes 500x-500x, 500y-500y, 500z-500z are about two times the size of electrodes 110x-110x, 110y-110y, 110z-110z, and may be disposed to define a cube that is about two times as large as that of a cube defined by the electrode pairs 110x, 110y, 110z. In some embodiments, auxiliary electrodes 500x-500x, 500y-500y, 500z-500z may be positioned generally parallel to electrodes 110x-110x, 110y-110y, 110z-110z, respectively.

In some embodiments, for example where electrode pairs 500x, 500y, 500z, are utilized, the electrode pairs 500x, 500y, 500z are electrically floating, i.e. they are not electrically connected to any of electrode pairs 110x, 110y, 110z, or to DSU 110 or sensor system 100. When not electrically connected, auxiliary electrode pairs 500x, 500y, 500z, may alter the electric field, but do not unacceptably affect the sensing thereof by electrode pairs 110x, 110y, 110z.

In some embodiments, when it is desired to confine or to direct the sensitivity of the electrode pairs 110x, 110y, 110z, in a particular direction, then one or more of auxiliary electrodes 500x-500x, 500y-500y, 500z-500z, are connected to one or more other auxiliary electrodes 500x-500x, 500y-500y, 500z-500z. One such connection is to make an electrical connection between the auxiliary electrode pairs 500x, 500y, 500z that are on the same axis.

In some embodiments, for example, when a high voltage source is overhead, as where high tension electrical power distribution lines are overhead, the auxiliary electrodes 500z-500z, which are spaced apart along the Z (or vertical) axis, may be connected together while making lateral (i.e. fore-aft and left-right) field measurements. As a result of this connection of auxiliary electrodes 500z-500z, vertically oriented fields, or at least primarily vertically oriented fields, from overhead sources are kept from leaking into or causing signal output on the X and Y axis electrode pairs 110x, 110y, or at least the effect of such vertically oriented fields on the X and Y axis electrode pairs 110x, 110y is substantially reduced. In addition, the pair of auxiliary electrodes 500z may be connected to a reference point, or to a ground, if available. Alternatively, any auxiliary electrode pair 500x, 500y, 500z, may be connected together to similarly alter directional sensitivity.

In some embodiments, for example, when a high voltage source is alongside, as where high tension electrical power distribution equipment is nearby and close to ground level, the two pair of auxiliary electrodes 500x and 500y, which are spaced apart along the X and Y (or lateral) axes, may be respectively connected together while making vertical (i.e. Z axis) field measurements. As a result of these connections of auxiliary electrode pairs 500x, 500y, laterally oriented fields, or at least primarily laterally oriented fields, from ground-level sources are kept from leaking into or causing signal output on the Z axis sensor electrode pair 110z, or at least the effect of such laterally oriented fields on the Z axis sensor electrode pair 110z is substantially reduced. In addition, and optionally, the pairs of auxiliary electrodes 500x, 500y may be connected to a reference point, or to a ground, if available. Alternatively, any two pair of auxiliary electrodes 500x, 500y, 500z, may be connected together to similarly increasing directional sensitivity. Further configurations for the electrodes 500x, 500y and 500z are described in related U.S. patent application Ser. No. 12/321,484, which is herein incorporated by reference in its entirety.

While the foregoing describes an embodiment comprising having six (three pair of) electrodes 110x-110x, 110y-110y, 110z-110z, and six (three pair of) auxiliary electrodes 500x-500x, 500y-500y, 500z-500z, such is not necessary. Typically any number of pairs of auxiliary electrodes that is less than or equal to the number of pairs of electrodes may provide a useful arrangement, and a greater number of auxiliary electrodes could be provided. For example, in a circumstance where the vertical field sensing electrodes 110z are omitted, it may be desirable to retain auxiliary electrodes 500z for directing the sensitivity for sensing non-vertical fields.

Figure 6:
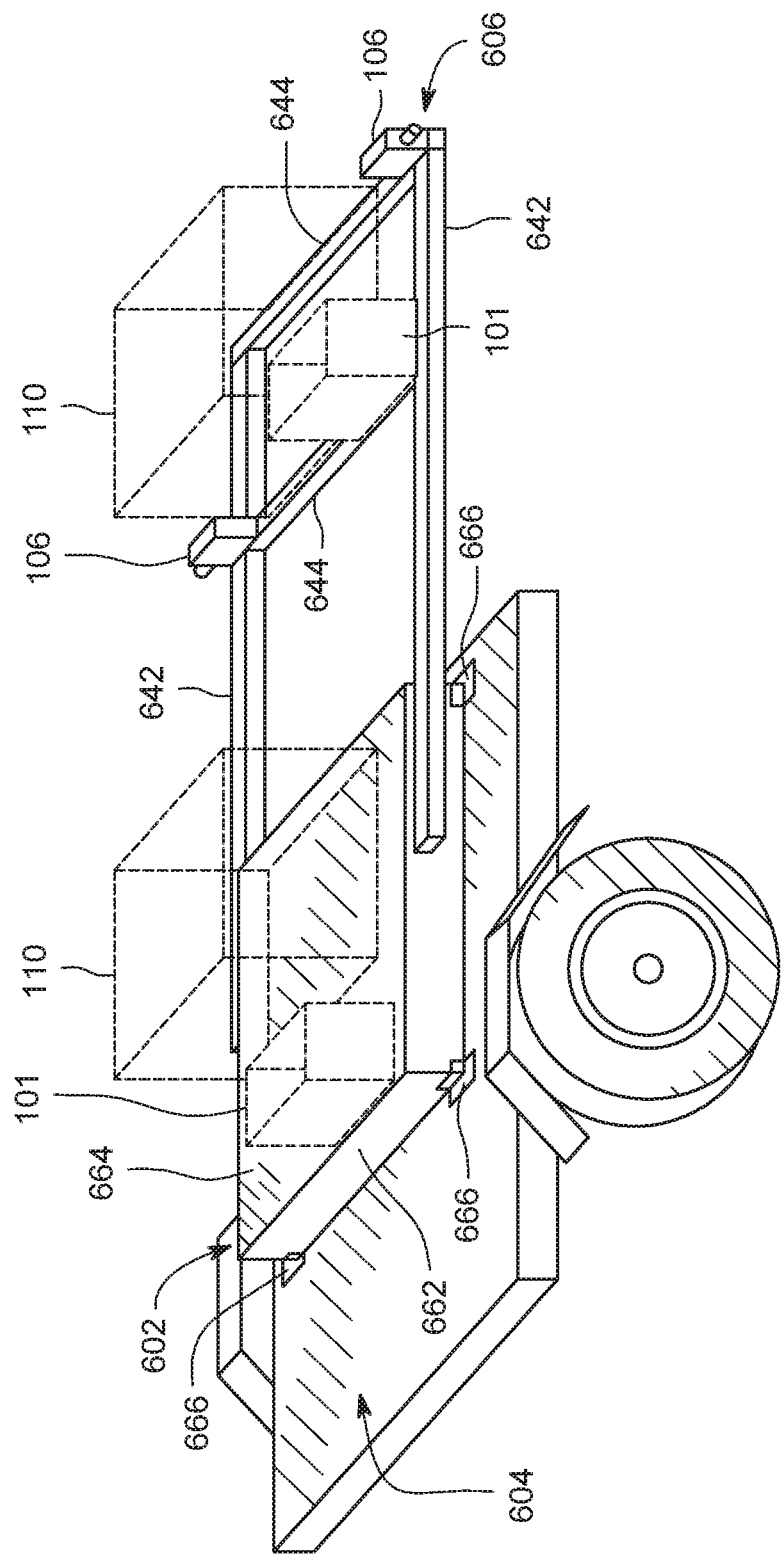
FIG. 6 is an illustration of a vehicle mounted sensor system in accordance with some embodiments of the present invention.

In some embodiments, such as depicted in FIG. 6, the DSU 110 and the photonic sensor 101 may be mounted on a support frame base 602 that is mounted to a vehicle, such as directly to a car or truck, or to a wheeled trailer 604 capable of being towed by a vehicle. The support frame base 602 may be constructed of any suitable material that would provide structural support and not interfere mechanically or electrically with the DSU 110, such as an insulating material, a dielectric plastic (e.g. PVC), wood, plywood, or the like. Additionally, the support frame base 602 is constructed so as not to interfere with the photonic sensor 101. In some embodiments, the support frame base 602 may be constructed of wood to provide for a rigid structure, while also providing damping so that resonances near 60 Hz may be avoided. In some embodiments, other insulating materials may be employed consistently with the high-input impedance of differential pre-amplifiers for electrodes 110x-110x, 110y-110y, 110z-110z.

The support frame base 602 may comprise a compartmented frame 662 having a top and bottom faces which can be filled with ballast. The compartmented frame 662 may be filled with a sufficient amount of ballast to approach the load weight limit for the trailer 604, e.g., about 100 pounds below the weight limit, so as to reduce the natural frequency of the trailer 604 and its suspension. In some embodiments, support frame base 602 is mounted to the bed of trailer 604 by four optional vibration isolators 666 located respectively at each of the four corners of support frame base 602 so as to reduce the natural frequency well below 60 Hz, e.g., to about 12.5 Hz.

In some embodiments, support frame base 602 is mounted directly to the bed of trailer 604 and DSU 110 is cantilevered behind trailer 604 along with the photonic sensor 644 on a support structure 606 comprising at least one outrigger (two shown) 642 that extend rearward so that DSU 110 is positioned behind the trailer 604. In some instances a grounded shield plate is placed beneath the photonic sensor 101 for protection and avoidance of interference. In some embodiments, DSU 110 and photonic sensor 101 may be positioned sufficiently enough away from the trailer 604 as to eliminate or reduce interference from metal surfaces or electrical sources on the trailer 604. In some embodiments, the sensors are positioned from about 0.9 to about 1.6 meters (about 3 to about 5 feet) from the from the rear of support frame base 602 and trailer 604, and about 0.9 to about 1.6 meters (about 3 to about 5 feet) above the ground (e.g., pavement).

Outriggers 642 may further comprise at least one (two shown) transverse members 644 to provide additional strength. Rearward portions of trailer 604, such as the rear cross member, may be removed to further separate DSU 110 and the photonic sensor 101 from metal that could distort the field being sensed.

In some embodiments, either fixed outriggers or telescoping or other form of collapsible outrigger or extension could be employed so that the DSU 110 and the photonic sensor 101, may be moved closer to the vehicle (i.e. stowed) for transit and farther from the vehicle (i.e. deployed) for operation to facilitate adjusting the sensitivity of sensors.

While a vehicle-borne sensor system 100 is described, it is contemplated that apparatus employing the arrangements and methods described herein may be provided in a case or backpack that could be carried by a person. In such embodiments, computer 136 may be a personal digital assistant or other small device.

Figure 7:
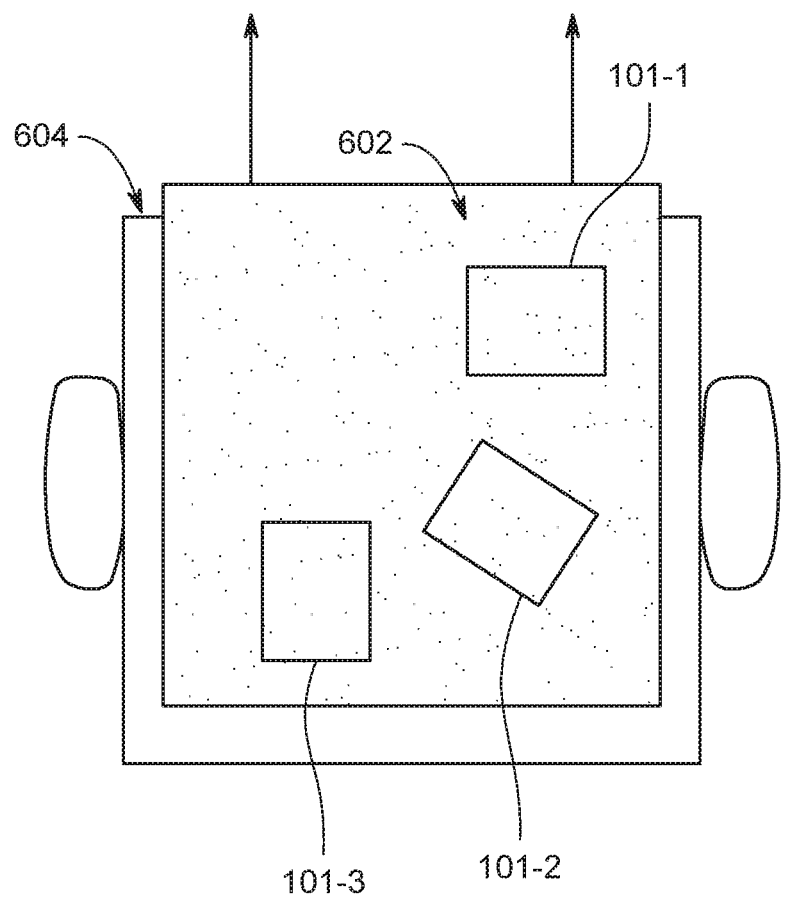
FIG. 7 is another illustration of a vehicle mounted sensor system in accordance with some embodiments of the present invention.

In some embodiments, such as depicted in FIG. 7, the photonic sensor 101 is mounted on a support frame base 602 that is mounted to a vehicle, such as directly to a car or truck, or to a wheeled trailer 604 capable of being towed by a vehicle. In this embodiment, three photonic sensors 101-1 to 101-3 are positioned at various locations on the base 602. In some instances, the photonic sensors are positioned with 45 degree offsets. In other instances, the photonic sensors may be positioned with 15 degree offsets. Those of ordinary skill in the art will recognize that various positions and rotations may be used to maximize the spectrum of readings from sensors 101-1 to 101-3. For example, in the configuration shown in FIG. 7, as an energized object comes into range of the trailer 604, the photonic sensor 101-1 may pick up an anomalous electric field first. As the vehicle passes the energized object, the photonic sensor 101-2 detects the electric field, and then the photonic sensor 101-3 detects the electric field, in sequence, allowing for a broader temporal range of detection of energized objects.

Figure 8:
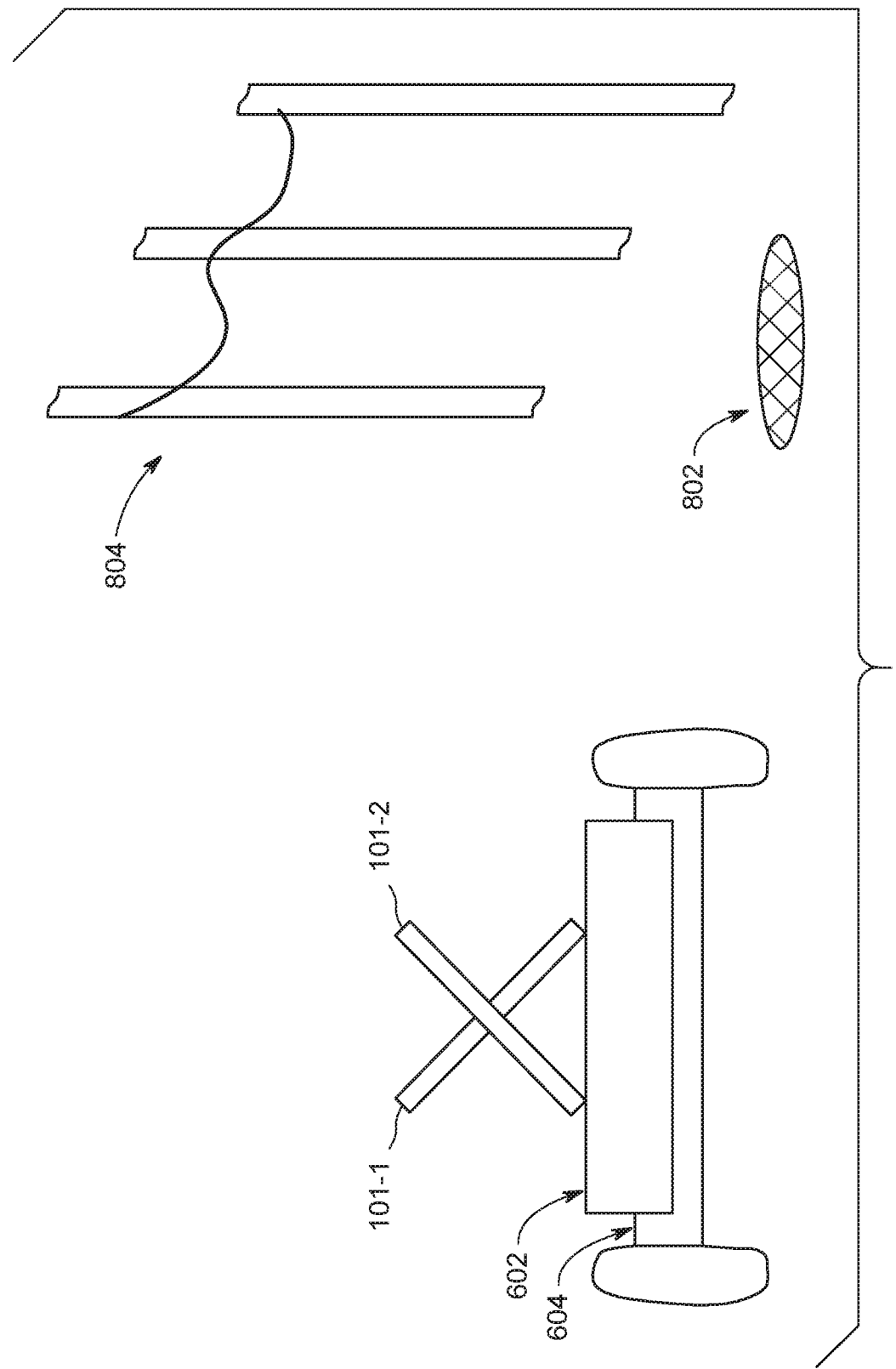
FIG. 8 is an illustration of a vehicle mounted sensor system in accordance with some other embodiments of the present invention.

Another embodiment is shown in FIG. 8, wherein a first photonic sensor 101-1 is positioned at an angle with the base 602, in some instances a 45 degree angle. A second photonic sensor 101-2 is positioned adjacent and transversal to the first photonic sensor 101-1, while positioned at an angle with the base 602 similar to the angle of the photonic sensor 101-1, i.e., the sensors are in a cross pattern, with the angle between the sensors being adjustable. In this embodiment, if, for example, the vehicle with trailer 604 travels underneath a set of overhead high-power transmission lines 804, and an energized object is nearby, such as manhole cover 802, the transversal arrangement of the photonic sensors will detect the manhole cover 802 without the interference of the electric field from the transmission lines 804. The transversal arrangement of the sensors causes one of the two sensors in the pair to achieve an improved signal to noise ratio. The sensor that is oriented away from the overhead power line will offer a better signal to noise ratio than the sensor that is oriented toward the overhead power line. A comparison between the two sensor outputs will allow the detection of the energized manhole cover in this scenario.

Figure 9:
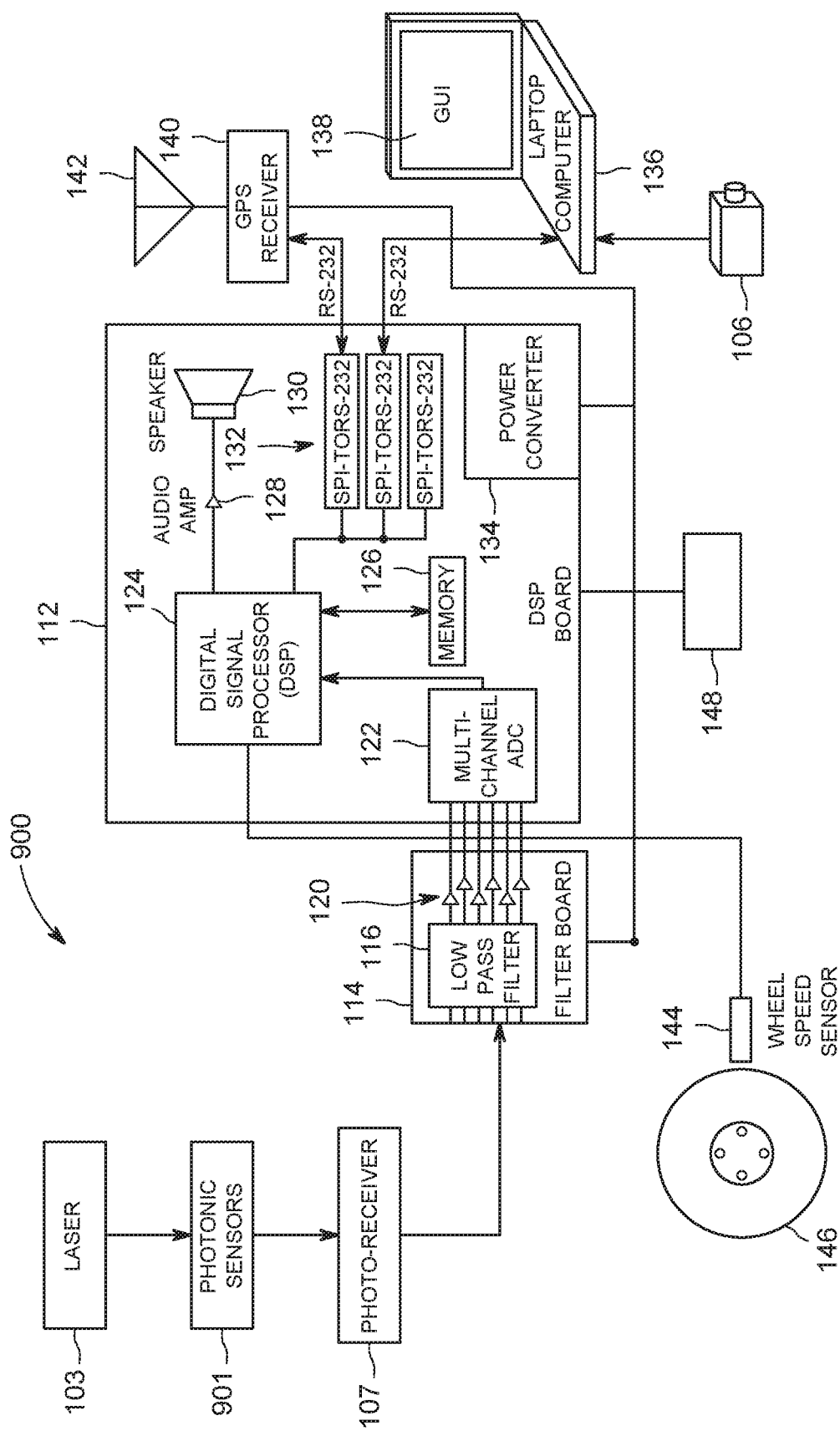
FIG. 9 is a schematic diagram of an exemplary sensor system in accordance with some embodiments of the present invention.

FIG. 9 is a schematic diagram of an exemplary sensor system in accordance with some embodiments of the present invention. In accordance with some embodiments of the present invention, sensor system 900 generally comprises two or more photonic sensor units, collectively referred to as sensors 901. In contrast to FIG. 1, this embodiment operates to detect hazardous energized objects without the DSU 110 by positioning and orienting the two or photonic sensors 901 so as to make each sensor sensitive to electric field in a particular angular portion of the area surrounding the system 900.

Figure 10:
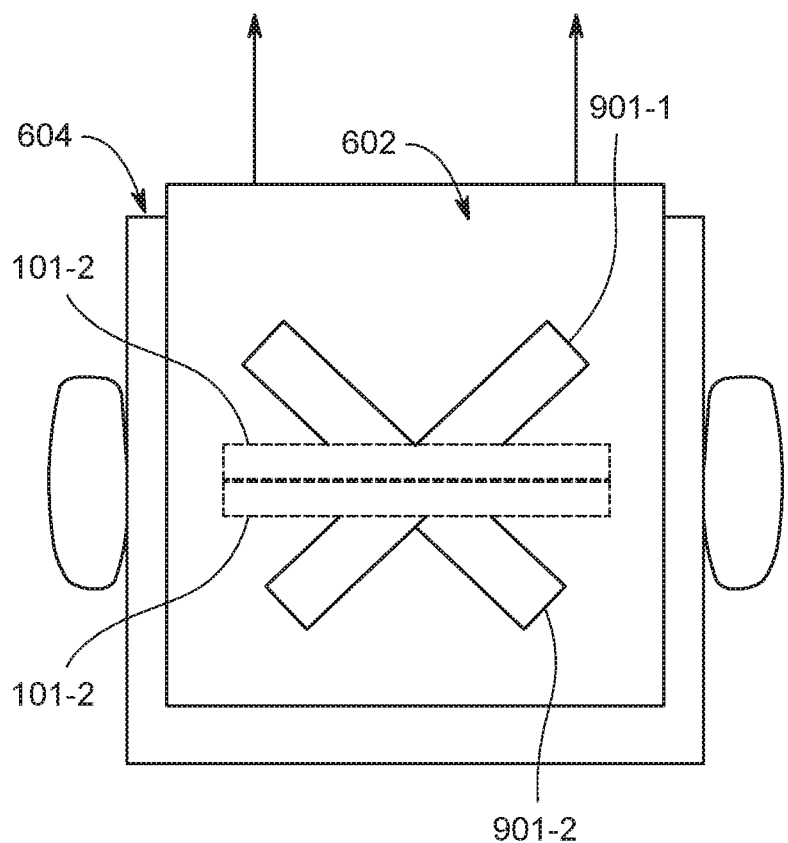
FIG. 10 is an illustration of a vehicle mounted sensor system in accordance with exemplary embodiments of the present invention.

In one embodiment, shown in FIG. 10, the photonic sensors 901-1 and 901-2 are positioned transverse to each other while lying flat on the base 602 of the vehicle. As the vehicle travels in any direction, the sensor 901-1 senses electric field of objects as the vehicle approaches near. As the vehicle passes an object, its electric field is detected via the sensor 901-2. Thus, the time period during which the surrounding electric field is sensed and analyzed is increased in order to more accurately determine whether an energized object is nearby. Optionally, the cross-configuration of photonic sensors 101-1 and 101-2 shown in FIG. 7 is combined with the configuration of photonic sensors 901-1 and 901-2 to increase the temporal and angular sensitivity of the system 900. While FIG. 10 illustrates an embodiment where each sensor set only contains a pair of photonic sensors, additional photonic sensors may be added to increase the sensitivity, accuracy and the range of the system 900.

The photonic sensors 901 accept the broadband laser 103 as input and each output a digital signal to a photo receiver 107. In some embodiments, each photonic sensor has a corresponding broadband laser directed towards it, and a corresponding photo-receiver that receives the digital signal, each photo-receiver being coupled to the DPS 112 via the analog section 114. According to exemplary embodiments, the photonic sensors 901 are composed of electro-optic (EO) materials. An electric field is established between a stray voltage source and the ground. The orientation of sensor 901 may be modified to detect horizontal or vertical field components, with a cross-polarization extinction ratio of approximately 20 dB. Multiple photonic sensors may also be used to expand the time range for detecting anomalous voltages. In some embodiments, the laser 103 may be a 1550 nm laser, coupled to the input of the sensors 901 via a polarization-maintaining (PM) fiber optic cable. The output from the photonic sensors 901 is coupled to the photo-receiver 107 via a single-mode fiber optic cable, the readings from which are coupled to the DPS 112 via the analog section 114. In some embodiments, the photonic sensors 901 are lithium niobate waveguide-based Mach Zehnder interferometers.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such.

In addition to the embodiments described above, additional features may be provided, as desired. For example, a 60-Hz signal source located inside DSU 110 to couple a 60-Hz signal thereto could provide a self-test function, i.e. when a self-test is performed by energizing the 60-Hz source. Sensor system 100 would then produce an audio indication, Log file, and/or other output, for a qualitative and/or quantitative test. Further, calibration and/or performance verification could be provided by DSU 110 and a commercially available accurate E-field measuring instrument at close range to a source of a relatively high field strength 60 Hz signal.

While the foregoing sensor, system, apparatus and method are described in terms of the 60 Hz electrical power system frequency common in the United States and other countries, the apparatus, arrangements and methods described herein are likewise applicable to the 50 Hz power systems of Europe and elsewhere, to the 400 Hz power systems for aircraft and other apparatus, to the 25 Hz power systems for transportation and other applications, and to power systems at any other frequency. Further, while the arrangement is often described in terms such as "stray voltage" and "voltage anomaly" and "stray voltage" field, it is noted that the electric field produced by the conditions so referred to is sensed and/or detected by the described arrangement.

While the foregoing is directed to embodiments of the present invention, other and further embodiments of the invention may be devised without departing from the basic scope thereof, and the scope thereof is determined by the claims that follow.

The invention claimed is:

1. A mobile apparatus mounted to a motor vehicle for detecting energized objects, comprising:
   at least one sensor probe, mounted to the motor vehicle, that detects an electric field generated by a stray voltage anomaly within an area, and generates a first signal corresponding to the electric field, wherein the at least one sensor probe comprises at least one electrode;
   at least one photonic sensor, mounted to the motor vehicle, that detects the electric field and generates a second signal corresponding to the electric field;
   a processor, coupled to the at least one sensor probe and the at least one photonic sensor, that (i) digitizes the first signal to form digitized first electric field data, (ii) produces, from the digitized first electric field data, first field strengths of each of the at least one sensor probe, (iii) analyzes the first field strengths to identify the area, (iv) digitizes the second signal to form digitized second electric field data, (v) produces, from the digitized second electric field data, second field strengths for the at least one photonic sensor, and (vi) analyzes the second field strengths to identify, within the area, a specific location of the stray voltage anomaly, wherein the digitized first and second electric field data is analyzed based on an expected frequency pertaining to the stray voltage anomaly; and
   an indicator, coupled to the processor, that alerts a user to a presence of the stray voltage anomaly at the specific location.

2. The mobile apparatus of claim 1, further comprising:
   a broadband laser optically coupled to an input of the at least one photonic sensor; and
   a photo receiver coupled to the at least one photonic sensor to receive a digital signal from the at least one photonic sensor, wherein the photo receiver outputs a signal corresponding to the electric field to the processor.

3. The mobile apparatus of claim 2, wherein the photo receiver is coupled to the at least one photonic sensor via a fiber-optic cable.

4. The mobile apparatus of claim 2, wherein the broadband laser is approximately a 1550 nm laser.

5. The mobile apparatus of claim 1, wherein the at least one sensor probe initially locates, prior to enabling the at least one photonic sensor, the area within which stray anomalous voltages are measured.

6. The mobile apparatus of claim 1, wherein the at least one photonic sensor further identifies the specific location subsequent to disabling measurement readings from the at least one sensor probe.

7. The mobile apparatus of claim 1, wherein the at least one photonic sensor is are composed of non-conducting material minimally perturbing to the electric field.

8. The mobile apparatus of claim 1, further comprising:
   a computer, coupled to the processor, that enables the at least one sensor probe initially to analyze field strength to determine if a potentially energized object is nearby, and subsequently enables the at least one photonic sensor once it is determined that the potentially energized object is nearby.

9. The mobile apparatus of claim 1, wherein the at least one photonic sensor comprises two or more photonic sensors that are mounted on the motor vehicle and are positioned in symmetrical rotational offsets from each other to broaden temporal range of detection of energized objects.

10. The mobile apparatus of claim 1, wherein the at least one photonic sensor comprises two or more photonic sensors that are mounted on the motor vehicle and are positioned in a cross pattern with respect to each other.

11. A mobile apparatus mounted to a motor vehicle for detecting energized objects, comprising:
two or more photonic sensors, mounted to the motor vehicle, and coupled to a photo-receiver, wherein the photo-receiver generates a signal corresponding to an electric field detected by the two or more photonic sensors, for narrowing down the location of a hazardously energized object;
a processor, coupled to the two or more photonic sensors, that digitizes the signal to form electric field data, produces field strengths of the two or more photonic sensors, analyzes the field strengths to identify a specific location of the hazardously energized object in the electric field, wherein the electric field data is analyzed based on an expected frequency pertaining to hazardous energy to locate the hazardously energized object proximate a street; and
an indicator, coupled to the processor, that alerts a user to a presence of the hazardously energized object in the electric field.

12. The mobile apparatus of claim 11, wherein the two or more photonic sensors are mounted on the motor vehicle transverse to each other and parallel to a base of the motor vehicle to expand temporal sensitivity.

13. The mobile apparatus of claim 12, wherein a second two or more photonic sensors, transverse to each other, are mounted perpendicular to a base of a motor vehicle to expand angular sensitivity.

14. The mobile apparatus of claim 11, further comprising a broadband laser optically coupled to an input of the two or more photonic sensors.

15. The mobile apparatus of claim 14, wherein the photo-receiver coupled to the two or more photonic sensors receives a digital signal from the two or more photonic sensors and the photo-receiver outputs a signal corresponding to the electric field to the processor.

\* \* \* \* \*